US012603622B2

(12) United States Patent
Outaleb et al.

(10) Patent No.: US 12,603,622 B2
(45) Date of Patent: Apr. 14, 2026

(54) APPARATUS AND METHODS FOR RADIO FREQUENCY AMPLIFIERS

(71) Applicant: Analog Devices International Unlimited Company, Limerick (IE)

(72) Inventors: Noureddine Outaleb, Ottawa (CA); Mohamed Weheiba, Cairo (EG)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 511 days.

(21) Appl. No.: 18/049,046

(22) Filed: Oct. 24, 2022

(65) Prior Publication Data

US 2023/0134681 A1 May 4, 2023

Related U.S. Application Data

(60) Provisional application No. 63/263,306, filed on Oct. 29, 2021.

(51) Int. Cl.
*H03F 3/45* (2006.01)
*H01Q 3/36* (2006.01)

(52) U.S. Cl.
CPC ........... *H03F 3/45179* (2013.01); *H01Q 3/36* (2013.01); *H03F 2200/06* (2013.01);
(Continued)

(58) Field of Classification Search
CPC ........ H01Q 3/28; H01Q 3/36; H03F 2200/06; H03F 2200/09; H03F 2200/294;
(Continued)

(56) References Cited

U.S. PATENT DOCUMENTS

| | | | |
|---|---|---|---|
| 7,295,065 B2 | 11/2007 | Shah et al. | |
| 7,315,207 B2 | 1/2008 | Shiikuma | |

(Continued)

FOREIGN PATENT DOCUMENTS

| | | |
|---|---|---|
| CN | 108768308 B | 6/2020 |
| WO | WO2021021934 A1 | 2/2021 |

OTHER PUBLICATIONS

Mannem et al., "Broadband Active Load-Modulation Power Amplification Using Coupled-Line Baluns: A Multifrequency Role-Exchange Coupler Doherty Amplifier Architecture," in IEEE Journal of Solid-State Circuits, vol. 56, No. 10, Oct. 2021 14 pages.
(Continued)

*Primary Examiner* — Nguyen T Vo
(74) *Attorney, Agent, or Firm* — Knobbe, Martens, Olson & Bear, LLP

(57) ABSTRACT

Apparatus and methods for radio frequency (RF) amplification are disclosed. In certain embodiments, an RF amplifier includes an output node configured to output an RF output signal, a main amplifier stage including a differential output, a first differential balun combiner configured to provide a first single-ended RF signal to the output node based on combining a first differential RF signal from the differential output of the main amplifier stage, an auxiliary amplifier stage including a differential output, a transformer component, and a second differential balun combiner configured to generate a second single-ended RF signal based on combining a second differential RF signal from the differential output of the auxiliary amplifier stage. The second differential balun combiner provides the second single-ended RF signal to the output node through the transformer component.

20 Claims, 12 Drawing Sheets

(52) U.S. Cl.
CPC .... *H03F 2200/09* (2013.01); *H03F 2200/294* (2013.01); *H03F 2200/451* (2013.01); *H03F 2200/541* (2013.01); *H03F 2203/45024* (2013.01)

(58) Field of Classification Search
CPC ......... H03F 2200/451; H03F 2200/541; H03F 2203/45024; H03F 3/195; H03F 3/245; H03F 3/265; H03F 3/45179; H03F 3/45188; H03F 3/602
See application file for complete search history.

(56) References Cited

U.S. PATENT DOCUMENTS

| | | | |
|---|---|---|---|
| 7,999,613 B2 | 8/2011 | Lawrence et al. | |
| 9,496,837 B2 | 11/2016 | Qureshi | |
| 9,621,115 B1 | 4/2017 | Wu | |
| 9,831,857 B2 | 11/2017 | Facchini et al. | |
| 10,547,279 B2 * | 1/2020 | Watkins | H03F 3/2176 |
| 10,742,174 B2 | 8/2020 | Roberts et al. | |
| 10,892,715 B2 | 1/2021 | Pan et al. | |
| 11,088,661 B2 | 8/2021 | Hill | |
| 2010/0007416 A1 * | 1/2010 | Meharry | H03F 3/211 |
| | | | 330/195 |
| 2018/0316312 A1 * | 11/2018 | Sharma | H03F 3/193 |
| 2020/0083848 A1 * | 3/2020 | Zhou | H03F 3/3001 |
| 2021/0050828 A1 * | 2/2021 | Paul | H03F 3/245 |
| 2022/0006429 A1 * | 1/2022 | Bao | H03F 3/195 |
| 2022/0109405 A1 * | 4/2022 | Khalili | H03F 3/005 |
| 2022/0239273 A1 * | 7/2022 | Kazuno | H01P 5/10 |
| 2022/0263475 A1 * | 8/2022 | Asbeck | H03F 1/302 |
| 2023/0091253 A1 * | 3/2023 | Wang | H03F 3/72 |
| | | | 330/124 R |
| 2023/0336203 A1 * | 10/2023 | Huang | H03F 3/245 |

OTHER PUBLICATIONS

Nguyen et al., "A Coupler-Based Differential mm-Wave Doherty Power Amplifier With Impedance Inverting and Scaling Baluns," in IEEE Journal of Solid-State Circuits, vol. 55, No. 5, May 2020, in 12 pages.

Nguyen et al., "A Linear High-Efficiency Millimeter-Wave CMOS Doherty Radiator Leveraging Multi-Feed On-Antenna Active Load Modulation," in IEEE Journal of Solid-State Circuits, vol. 53, No. 12, pp. 3587-3598, Dec. 2018.

Nguyen et al., "A Coupler-Based Differential Doherty Power Amplifier with Built-In Baluns for High Mm-Wave Linear-Yet-Efficient Gbiy/s Amplifications", 2019 IEEE Radio Frequency Integrated Circuits Symposium (RFIC) in 4 pages.

Ramella et al., "High Efficiency Power Amplifiers for Modern Mobile Communications: The Load-Modulation Approach" Electronics 2017; 6(4):96 published Nov. 13, 2017 in 29 pages.

Wang et al., "Millimeter-Wave Power Amplifier Integrated Circuits for High Dynamic Range Signals," in IEEE Journal of Microwaves, vol. 1, No. 1, Jan. 2021, in 18 pages.

* cited by examiner

FRONT END

FRONT END

FREQ (26.00GHz TO 28.00GHz)

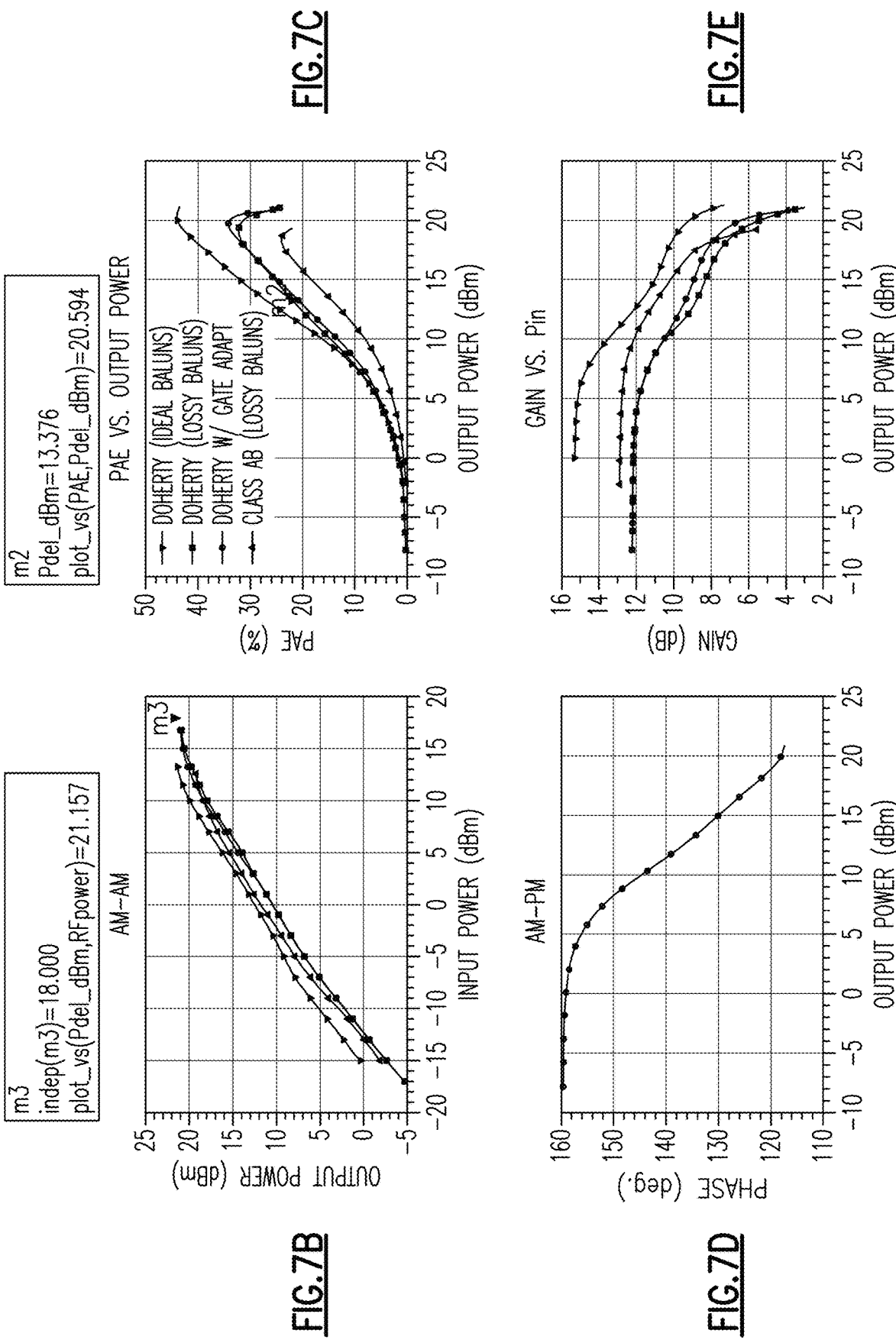

APPARATUS AND METHODS FOR RADIO FREQUENCY AMPLIFIERS

CROSS-REFERENCE TO RELATED APPLICATIONS

The present application claims priority to U.S. Provisional Patent Application No. 63/263,306, filed Oct. 29, 2021, and titled "APPARATUS AND METHODS FOR RADIO FREQUENCY AMPLIFIERS," the entirety of which is hereby incorporated herein by reference.

FIELD OF THE DISCLOSURE

Embodiments of the invention relate to electronic systems, and more particularly, to radio frequency (RF) amplifiers.

BACKGROUND

RF amplifiers are used in a variety of applications to amplify RF signals. Example applications using RF amplifiers include ultrasound, radar, lidar, and/or cellular communications.

In one example, a phased array antenna system includes RF amplifiers along RF signal paths to an antenna array, thereby providing a mechanism for amplifying RF signals that are combined using constructive and destructive interference to provide beamforming.

SUMMARY OF THE DISCLOSURE

Apparatus and methods for radio frequency (RF) amplification are disclosed. In certain embodiments, an RF amplifier includes an output node configured to output an RF output signal, a main amplifier stage including a differential output, a first differential balun combiner configured to provide a first single-ended RF signal to the output node based on combining a first differential RF signal from the differential output of the main amplifier stage, an auxiliary amplifier stage including a differential output, a transformer component, and a second differential balun combiner configured to generate a second single-ended RF signal based on combining a second differential RF signal from the differential output of the auxiliary amplifier stage. The second differential balun combiner provides the second single-ended RF signal to the output node through the transformer component.

By implementing the RF amplifier in this manner, high efficiency amplification is provided. Furthermore, efficient power combination can be achieved with low loss. Moreover, the transformer component can provide the impedance transformation operation needed for proper Doherty operation, and can be limited as a lumped element components rather than a coupled-line balun, which is lossy, narrowband and/or space consuming.

In one aspect, an RF amplifier includes an output node configured to output an RF output signal, a main amplifier stage including a differential output, a first differential balun combiner configured to provide a first single-ended RF signal to the output node based on combining a first differential RF signal from the differential output of the main amplifier stage, an auxiliary amplifier stage including a differential output, a transformer component, and a second differential balun combiner configured to generate a second single-ended RF signal based on combining a second differential RF signal from the differential output of the auxiliary amplifier stage, and to provide the second single-ended RF signal to the output node through the transformer component.

In another aspect, a front end system for controlling beamforming in an active scanned electronically steered array is provided. The front end system includes a phase shifter configured to control a phase of a radio frequency (RF) input signal, and an RF amplifier in series with the phase shifter and configured to amplify the RF input signal to generate an RF output signal at an output node. The RF amplifier includes a main amplifier stage including a differential output, a first differential balun combiner configured to provide a first single-ended RF signal to the output node based on combining a first differential RF signal from the differential output of the main amplifier stage, an auxiliary amplifier stage including a differential output, a transformer component, and a second differential balun combiner configured to generate a second single-ended RF signal based on combining a second differential RF signal from the differential output of the auxiliary amplifier stage, and to provide the second single-ended RF signal to the output node through the transformer component.

In another aspect, a method of radio frequency (RF) signal amplification is provided. The method includes amplifying a first differential RF input signal to generate a first differential RF signal using a main amplifier stage, generating a first single-ended RF signal for an output node based on combining the first differential RF signal using a first differential balun combiner, amplifying a second differential RF input signal to generate a second differential RF signal using an auxiliary amplifier stage, generating a second single-ended RF signal based on combining the second differential RF signal using a second differential balun combiner, and providing the second single-ended RF signal to the output node through a transformer component.

BRIEF DESCRIPTION OF THE DRAWINGS

FIG. 7B is a graph of one example of output power versus input power for an RF amplifier.

FIG. 7C is a graph of one example of efficiency versus output power for an RF amplifier.

FIG. 7D is a graph of one example of phase distortion versus output power for an RF amplifier.

FIG. 7E is a graph of one example of amplitude distortion versus output power for an RF amplifier.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1:
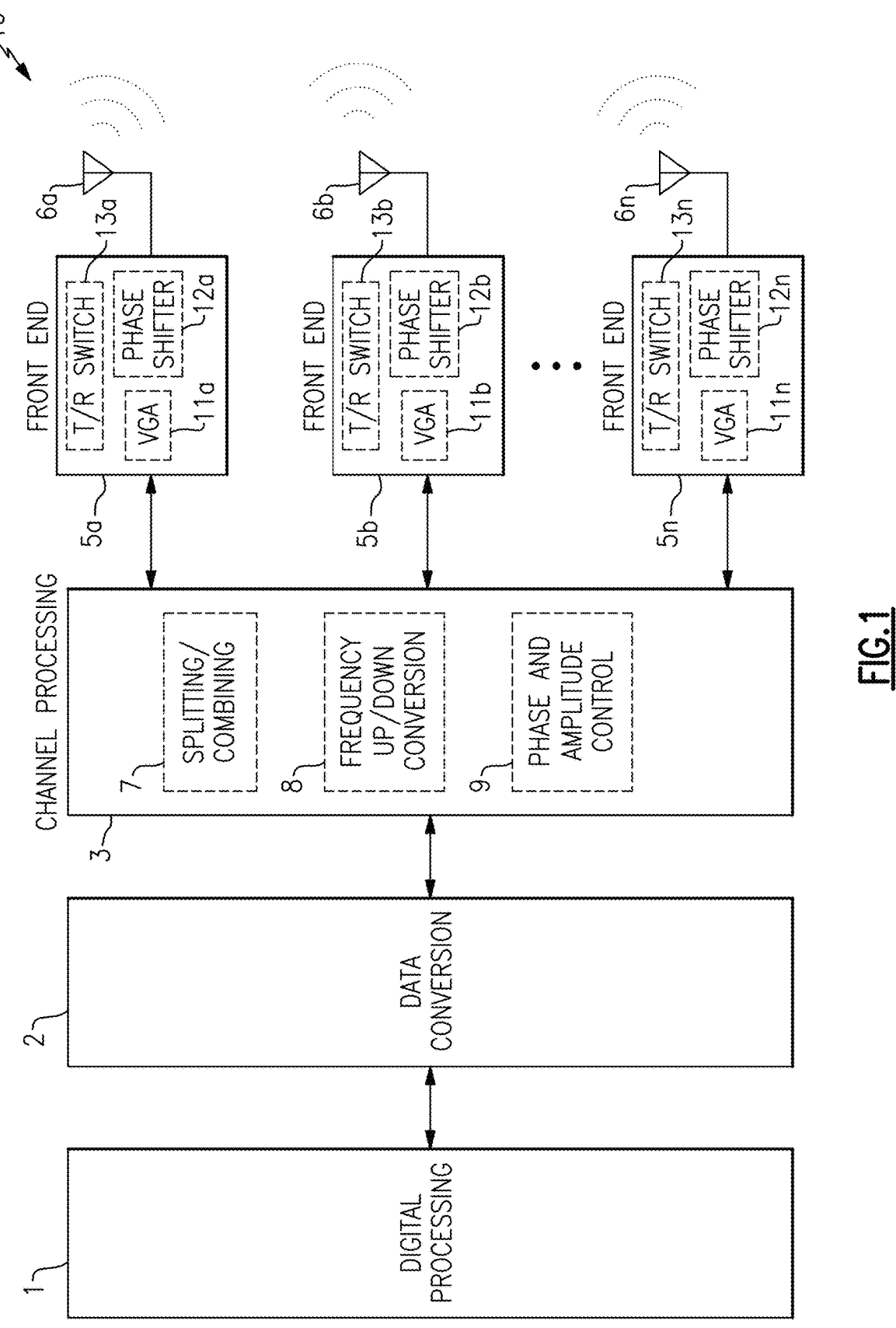
FIG. 1 is a schematic diagram of one embodiment of a phased array antenna system including RF amplifiers.

FIG. 1 is a schematic diagram of one embodiment of a phased array antenna system 10 including RF amplifiers. The phased array antenna system 10 includes a digital processing circuit 1, a data conversion circuit 2, a channel processing circuit 3, RF front ends 5a, 5b, . . . 5n, and antennas 6a, 6b, . . . 6n. Although an example system with three RF front ends and three antennas is illustrated, the phased array antenna system 10 can include more or fewer RF front ends and/or more or fewer antennas as indicated by the ellipses. Furthermore, in certain implementations, the phased array antenna system 10 is implemented with separate antennas for transmitting and receiving signals.

The phased array antenna system 10 illustrates one embodiment of an electronic system that can include one or more RF amplifiers implemented in accordance with the teachings herein. However, the RF amplifiers disclosed herein can be used in a wide range of electronics. A phased array antenna system is also referred to herein as an active scanned electronically steered array or beamforming communication system.

As shown in FIG. 1, the channel processing circuit 3 is coupled to antennas 6a, 6b, . . . 6n through RF front ends 5a, 5b, . . . 5n, respectively. The channel processing circuit 3 includes a splitting/combining circuit 7, a frequency up/down conversion circuit 8, and a phase and amplitude control circuit 9, in this embodiment. The channel processing circuit 3 provides RF signal processing of RF signals transmitted by and received from each communication channel. In the illustrated embodiment, each communication channel is associated with a corresponding RF front end and antenna.

With continuing reference to FIG. 1, the digital processing circuit 1 generates digital transmit data for controlling a transmit beam radiated from the antennas 6a, 6b, . . . 6n. The digital processing circuit 1 also processes digital receive data representing a receive beam. In certain implementations, the digital processing circuit 1 includes one or more baseband processors.

As shown in FIG. 1, the digital processing circuit 1 is coupled to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front ends 5a, 5b, . . . 5n and subsequent transmission on the antennas 6a, 6b, . . . 6n. Additionally, the splitting/combining circuit 7 combines RF signals received vias the antennas 6a, 6b, . . . 6n and RF front ends 5a, 5b, . . . 5n to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, . . . 6n to provide beamforming. With respect to signal transmission, the RF signal waves radiated from the antennas 6a, 6b, . . . 6n aggregate through constructive and destructive interference to collectively generate a transmit beam having a particular direction. With respect to signal reception, the channel processing circuit 3 generates a receive beam by combining the RF signals received from the antennas 6a, 6b, . . . 6n after amplitude scaling and phase shifting.

Phased array antenna systems are used in a wide variety of applications including, but not limited to, mobile communications, military and defense systems, and/or radar technology.

As shown in FIG. 1, the RF front ends 5a, 5b, . . . 5n each include one or more VGAs 11a, 11b, . . . 11n, which are used to scale the amplitude of RF signals transmitted or received by the antennas 6a, 6b, . . . 6n, respectively. Additionally, the RF front ends 5a, 5b, . . . 5n each include one or more phase shifters 12a, 12b, . . . 12n, respectively, for phase-shifting the RF signals. For example, in certain implementations the phase and amplitude control circuit 9 generates gain control signals for controlling the amount of gain provided by the VGAs 11a, 11, . . . 11n and phase control signals for controlling the amount of phase shifting provided by the phase shifters 12a, 12b, . . . 12n.

The phased array antenna system 10 operates to generate a transmit beam and/or receive beam including a main lobe pointed in a desired direction of communication. The phased array antenna system 10 realizes increased signal to noise (SNR) ratio in the direction of the main lobe. The transmit and/or receive beam also includes one or more side lobes, which point in different directions than the main lobe and are undesirable.

An accuracy of beam direction of the phased array antenna system 10 is based on a precision in controlling the gain and phases of the RF signals communicated via the antennas 6a, 6b, . . . 6n. For example, when one or more of the RF signals has a large phase error, the beam can be broken and/or pointed in an incorrect direction. Furthermore, the size or magnitude of beam side lobe levels is based on an accuracy in controlling the phases and amplitudes of the RF signals.

Accordingly, it is desirable to tightly control the phase and amplitude of RF signals communicated by the antennas 6a, 6b, . . . 6n to provide robust beamforming operations.

Although the RF amplifiers herein can be used in beamforming communications, the teachings herein are also applicable to other types of electronic systems.

Figure 2A:
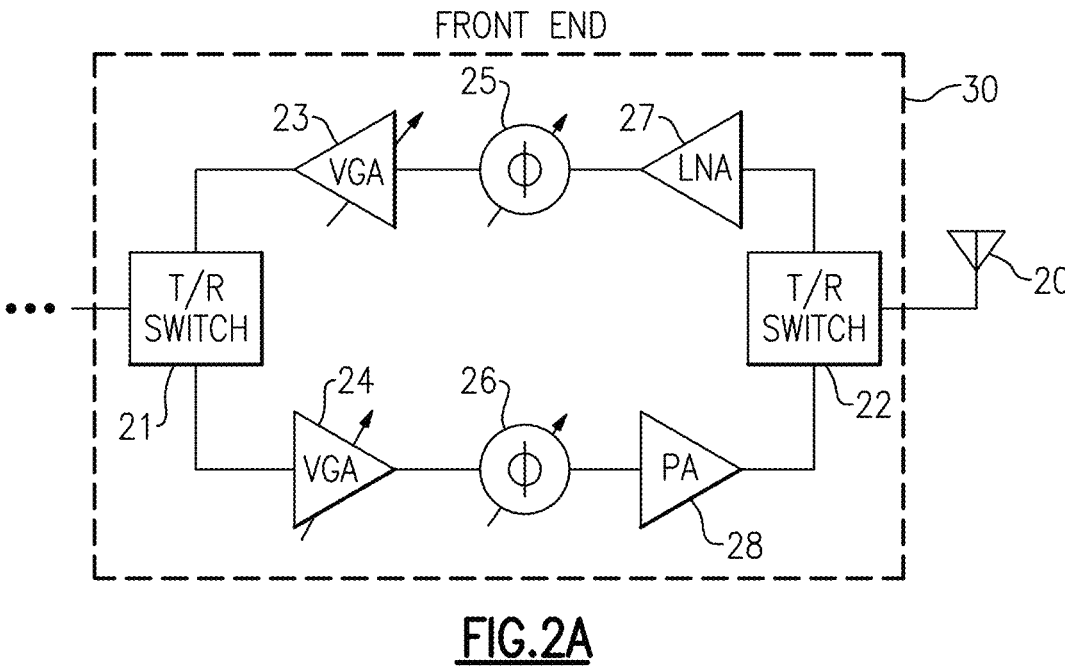
FIG. 2A is a schematic diagram of one embodiment of a front end system including RF amplifiers.

FIG. 2A is a schematic diagram of one embodiment of a front end system 30 including RF amplifiers. The front end system 30 includes a first transmit/receive (T/R) switch 21, a second transmit/receive switch 22, a receive-path VGA 23, a transmit-path VGA 24, a receive-path controllable phase shifter 25, a transmit-path phase shifter 26, a low noise amplifier (LNA) 27, and a power amplifier (PA) 28. As shown in FIG. 2A, the front end system 30 is depicted as being coupled to an antenna 20.

The front end system 30 can be included in a wide variety of RF systems, including, but not limited to, phased array antenna systems, such as the phased array antenna system 10 of FIG. 1. For example, multiple instantiations of the front end system 30 can be used to implement the RF front ends 5a, 5b, . . . 5n of FIG. 1. In certain implementations, one or more instantiations of the front end system 30 are fabricated on a semiconductor die or chip.

As shown in FIG. 2A, the front end system 30 includes the receive-path VGA 23 for controlling an amount of amplification provided to an RF input signal received on the antenna 20, and the transmit-path VGA 24 for controlling an amount of amplification provided to an RF output signal transmitted on the antenna 20. Additionally, the front end system 30 includes the receive-path controllable phase shifter 25 for controlling an amount of phase shift to an RF input signal received on the antenna 20, and the transmit-path controllable phase shifter 26 for controlling an amount of phase shift provided to the RF output signal transmitted on the antenna 20.

The gain control provided by the VGAs and the phase control provided by the phase shifters can serve a wide variety of purposes including, but not limited to, compensating for temperature and/or process variation. Moreover, in beamforming applications, the VGAs and phase shifters can control side-lobe levels of a beam pattern.

Figure 2B:
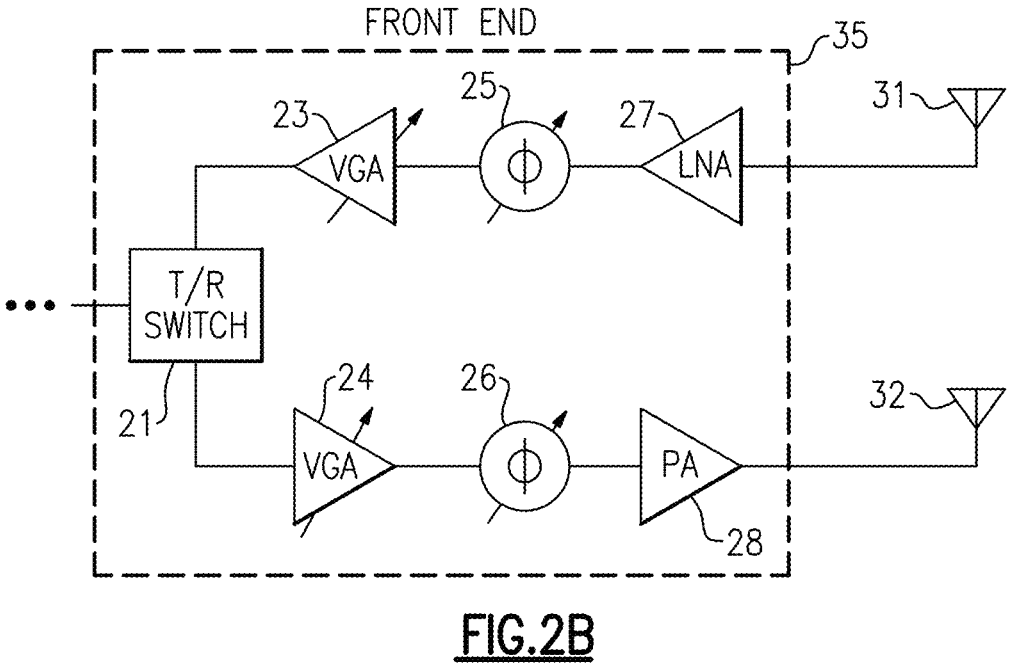
FIG. 2B is a schematic diagram of another embodiment of a front end system including RF amplifiers.

FIG. 2B is a schematic diagram of another embodiment of a front end system 35 including RF amplifiers. The front end system 35 of FIG. 2B is similar to the front end system 30 of FIG. 2A, except that the front end system 35 omits the second transmit/receive switch 22. As shown in FIG. 2B, the front end system 35 is depicted as being coupled to a receive antenna 31 and to a transmit antenna 32.

The front end system 35 operates with different antennas for signal transmission and reception. In the illustrated embodiment, the receive-path VGA 23 controls an amount of amplification provided to an RF input signal received on the receive antenna 31, and the transmit-path VGA 24 controls an amount of amplification provided to an RF output signal transmitted on the second antenna 32. Additionally, the receive-path phase shifter 25 controls an amount of phase shift provided to the RF input signal received on the receive antenna 31, and the transmit-path phase shifter 26 controls an amount of phase shift provided to an RF output signal transmitted on the second antenna 32.

Certain RF systems include separate antennas for transmission and reception of signals.

Figures 3A, 3B:
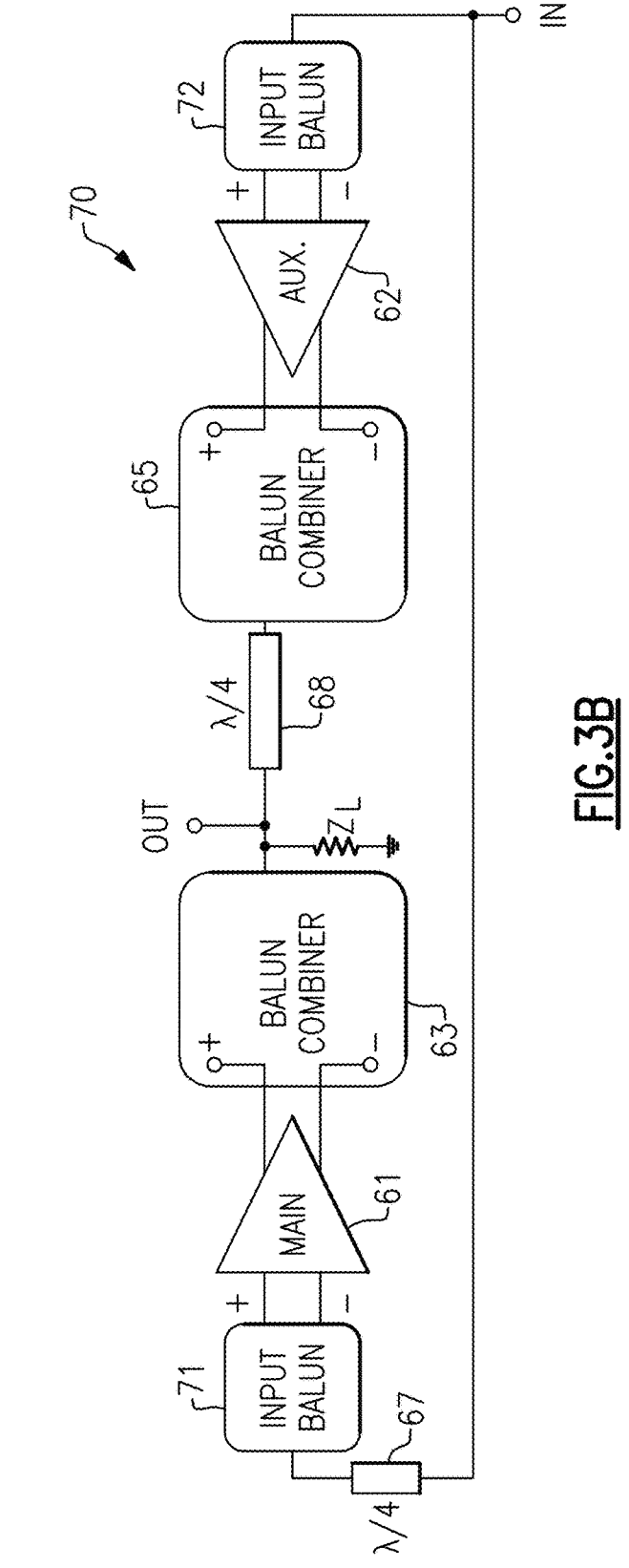
FIG. 3A is a schematic diagram of an RF amplifier according to one embodiment.
FIG. 3B is a schematic diagram of an RF amplifier according to another embodiment.

FIG. 3A is a schematic diagram of an RF amplifier 60 according to one embodiment. The RF amplifier 60 is implemented as inverted Doherty amplifier that includes a first amplifier stage 61 (also referred to herein as a main amplifier stage or carrier amplifier stage), a second amplifier stage 62 (also referred to herein as an auxiliary or peaking amplifier stage), a first differential balun combiner 63 for the main amplifier stage 61, a second differential balun combiner 65 for the auxiliary amplifier stage 62, and a transformer component 68 (corresponding to a quarter wave length transformer, in this example). Although an embodiment with a quarter wave length transformer is shown, other impedance transformer components, such as a lumped element transformer, can be used.

In the illustrated embodiment, the first amplifier stage 61 amplifies a first differential RF input signal $RF_{IN1}$ to generate a first differential RF output signal, while the second amplifier stage 62 amplifies a second differential RF input signal $RF_{IN2}$ to generate a second differential RF output signal.

As shown in FIG. 3, the first differential balun combiner 63 combines the non-inverted and inverted components of the first differential RF output signal from the first amplifier stage 61 to generate a first RF signal provided to a combining node OUT. Additionally, the second differential balun combiner 65 combines the non-inverted and inverted components of the second differential RF output signal from the second amplifier stage 62 to generate a second RF signal provided to the combining node OUT through the transformer component 68. The combined RF signal at the combining node OUT can be provided to a load $Z_L$, such as an antenna used for wireless transmission.

FIG. 3B is a schematic diagram of an RF amplifier 70 according to another embodiment. The RF amplifier 70 includes a first amplifier stage 61, a second amplifier stage 62, a first differential balun combiner 63, a second differential balun combiner 65, an input transformer component 67 (corresponding to a quarter wave length transformer, in this example), an output transformer component 68 (corresponding to a quarter wave length transformer, in this example), a first input balun 71, and a second input balun 72. Although an embodiment with quarter wave length transformers is shown, other transformer components, such as a lumped element transformers, can be used.

The RF amplifier 70 receives an RF input signal from an input node IN. The RF input signal is phase-shifted by the input transformer component 67 (by about a quarter wave length or 90° of a carrier frequency of the RF input signal) and subsequently converted by the first input balun 71 to a first differential RF input signal that is provided to the first amplifier stage 61. Additionally, the RF input signal is converted by the second input balun 72 to a second differential RF input signal that is provided to the second amplifier stage 62.

As shown in FIG. 3B, in some embodiments a single-ended RF input signal is received by an RF amplifier, and converted using input baluns into differential RF inputs signals amplified by the first amplifier stage 61 and the second amplifier stage 62.

Figure 4:
FIG. 4 is a layout of a balun according to one embodiment.
Figure 4:
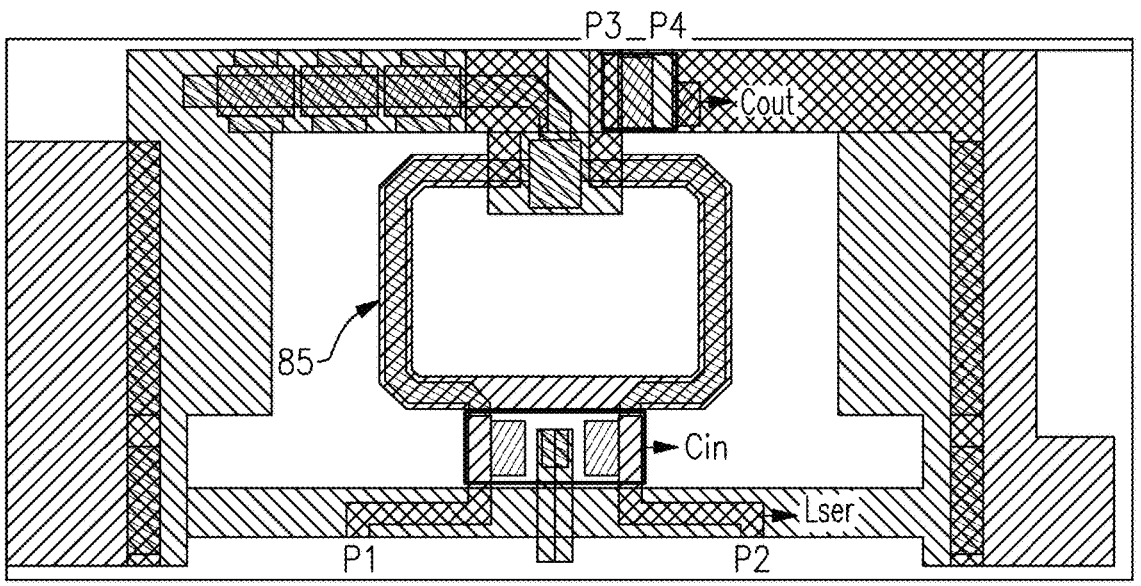

FIG. 4 is a layout 80 of a balun according to one embodiment. The balun layout 80 includes a first port P1, a second port P2, a third port P3, a fourth port P4, and conductors 85. The first port p1 and the second port P2 are input ports, while the third port P3 and the fourth port P4 are output ports.

Two instances of the balun layout 80 can be used to implement the differential balun combiners shown in FIGS. 3A and 3B.

In contrast to conventional differential Doherty amplifiers that use a coupled-line balun (which is lossy, narrowband and space consuming), a lumped element balun can be used to provide the impedance transformation operation needed for proper Doherty operation. The same balun can be used at the output of the auxiliary stage which in this case is also used to modulate the load seen by the main amplifier stage through its output balun transformer. A quarter wave length transformer component 68 (for example, transformer component 68 of FIGS. 3A and 3B) is added to the auxiliary output balun to ensure an open circuit at the Doherty combining node. Thus, the matched baluns are used in conjunction with the quarter wave length transformer.

The differential inverted Doherty amplifiers herein provide efficient amplification at high frequency, for example, millimeter wave frequencies such as 28 GHz frequency band. The Doherty amplifier maintains its peak efficiency over 6 dB to 9 dB back off using load modulation set by the input signal levels in conjunction with the auxiliary stage and the output combiner/inverter. Using a differential Doherty aids in achieving desired output power level suitable for millimeter wave frequencies. The Doherty amplifier uses differential baluns to allow efficient power combination with low loss.

Conventional differential Doherty amplifies use coupled based balun transformers to modulate the differential load seen by the main stage. Coupled based baluns are typically Marchand baluns, which are lossy and space consuming. To reduce the size of these couplers, the lengths are reduced, which has a direct impact on the amplifier's bandwidth.

In contrast, certain embodiments herein use a much more compact matching balun is used. In additional to the impedance load modulation that the matching balun provides, the matching balun absorbs the output matching network of the field-effect transistors (FETs) as well, which reduces further the losses and enhances the efficiency of the Doherty. The same matching balun can be used at the output of the auxiliary stage.

Figure 5A:
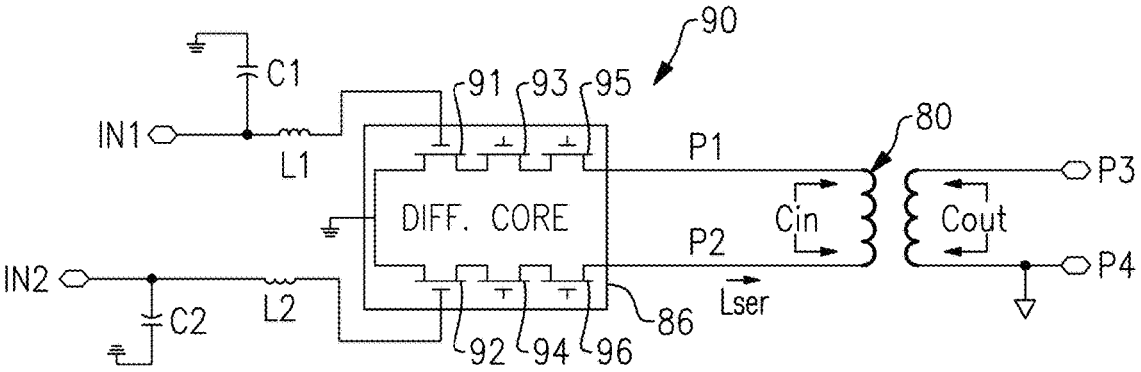
FIG. 5A is a schematic diagram of an RF amplifier stage and balun according to one embodiment.

FIG. 5A is a schematic diagram of an RF amplifier stage 90 and balun 80 according to one embodiment.

The amplifier stage 90 is coupled to a first input terminal IN+ and a second input terminal IN−, and includes a first series input matching inductor L1, a first shunt input matching capacitor C1, a second series input matching inductor L2, a second shunt input matching capacitor C2, a first common-source field-effect transistor (FET) 91, a second common-source FET 92, a first pair of cascode FETs 93/95, and a second pair of cascode FETs 94/96. The amplifier stage 90 can represent either the main amplifier stage or auxiliary amplifier stage of a Doherty amplifier.

The balun 80 includes a first port P1 and a second port P2, which are coupled to a differential output of the amplifier stage 90. The balun 80 further includes a third port P3 for outputting a single-ended RF signal and a fourth port P4, which is grounded. The balun 80 has a series input inductance Lser, an input capacitance Cin, and an output capacitance Cout.

The amplifier stage 90 is a triple stacked-FET amplifier stage including a differential common-source transistor pair each connected with two cascode transistors. For example, the first common-source FET 91 is connected in series with the first pair of cascode FETs 93/95 between ground and the first port P1 of the balun 80. Additionally, the second common-source FET 92 is connected in series with the second pair of cascode FETs 94/96 between ground and the second port P2 of the balun 80.

Although a particular type of amplifier stage is shown, the teachings herein are applicable to a wide range of types of amplifier stages including cascode stages as well as other stage types. Moreover, although three stacked devices are shown, more or fewer devices can be stacked.

The inductor-capacitor (LC) matching network is absorbed into the balun layout such that the drains of the topmost stacked transistors directly drive the balun's differential input (ports P1 and P2). Thus, no explicit matching network components are needed for connecting between the differential output of the RF amplifier stage 90 and the differential input to the balun 80.

Accordingly, the output matching network of the RF amplifier stage 90 is absorbed into the layout of the balun 80, thereby leading to a compact layout implementation with low losses.

Figure 5B:
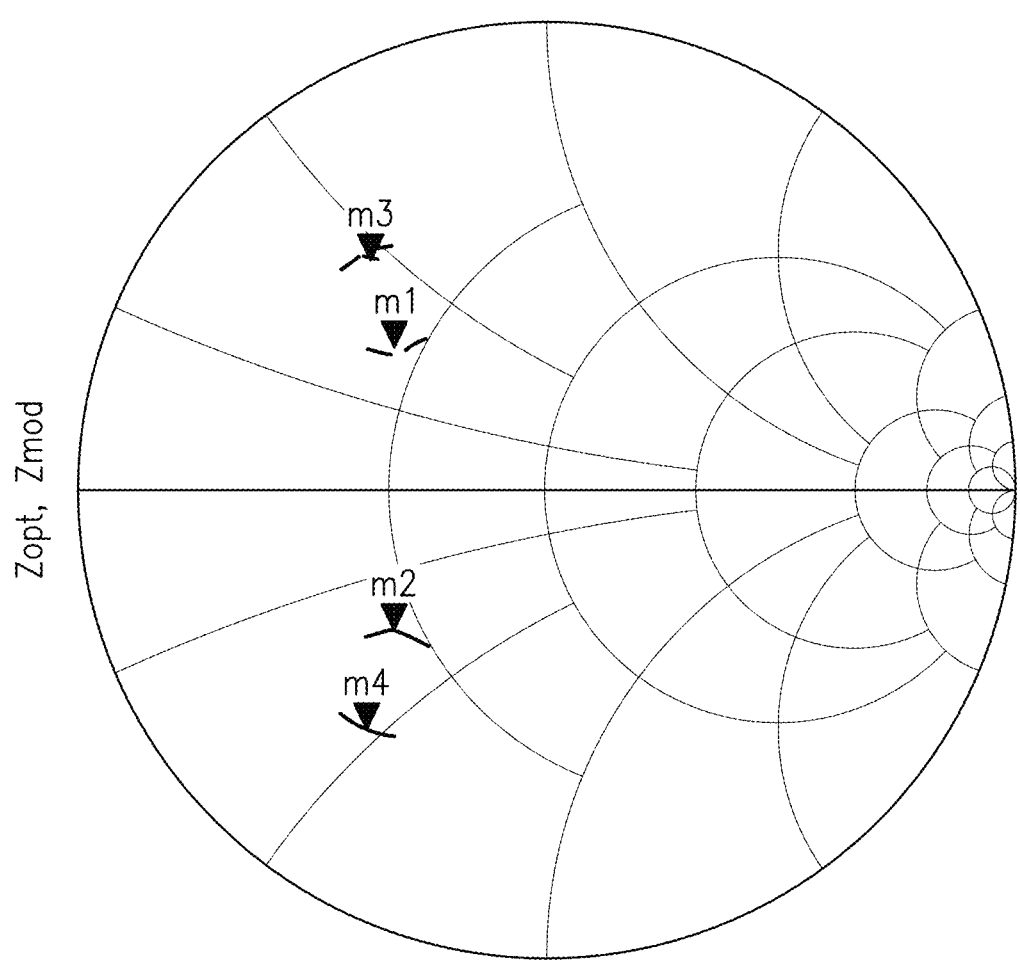
FIG. 5B is one example of a Smith chart for the RF amplifier stage and balun of FIG. 5A.

FIG. 5B is one example of a Smith chart for the RF amplifier stage 90 and balun 80 of FIG. 5A.

The impedance locations in the Smith chart suggest the use of an inverted Doherty. The inverted Doherty has the advantage of being broadband and more compact, which is ideal for applications with limited Silicon area. A quarter wave length transformer is added to the output of the auxiliary stage to transform the short circuit to an open circuit at the combining node of the Doherty amplifier.

Figure 6:
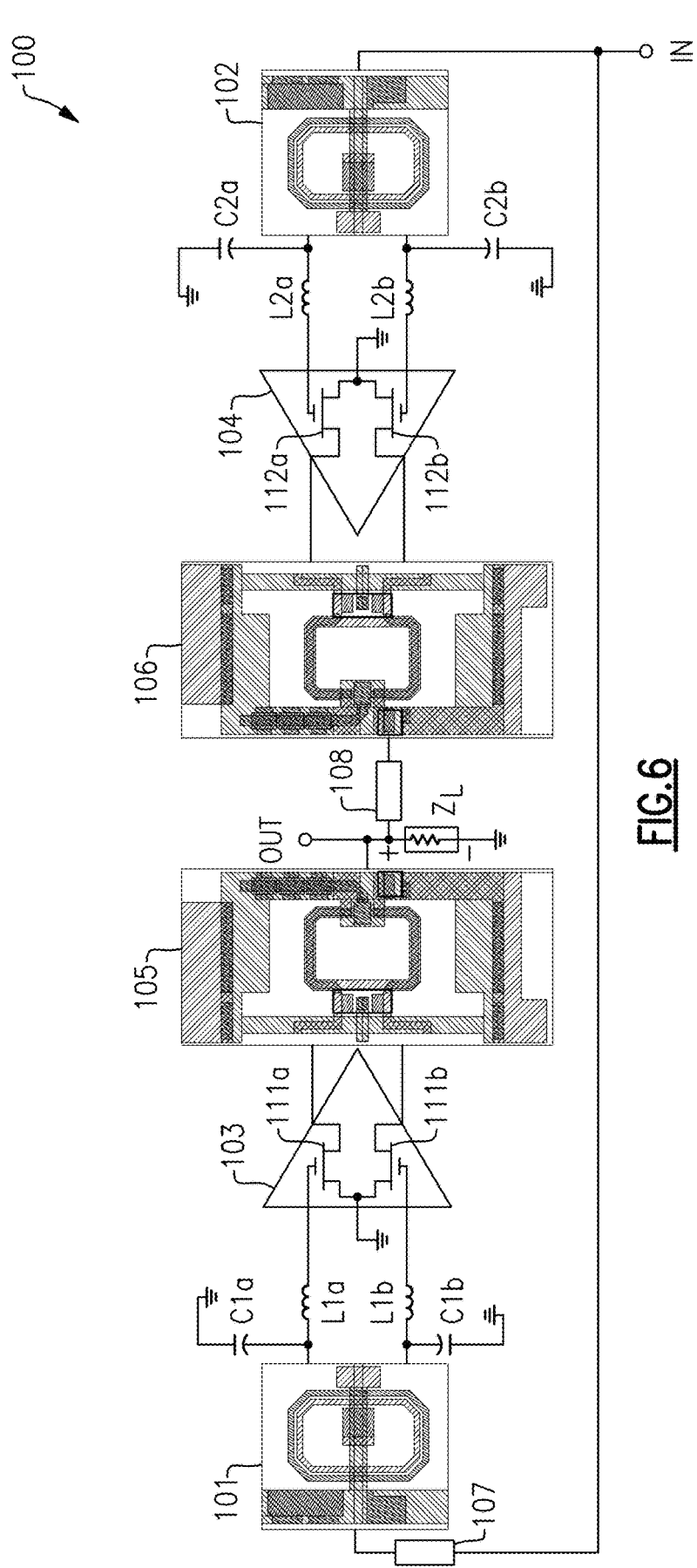
FIG. 6 is a schematic diagram of an RF amplifier according to another embodiment.

FIG. 6 is a schematic diagram of an RF amplifier 100 according to another embodiment. The RF amplifier 100 includes a first amplifier stage 103, a second amplifier stage 104, a first differential balun combiner 105, a second differential balun combiner 106, an input transformer component 107, an output transformer component 108, a first input balun 101, a second input balun 102, input matching series inductors L1a/L1b for the first amplifier stage 103, input matching shunt capacitors C1a/C1b for the first amplifier stage 103, input matching series inductors L2a/L2b for the second amplifier stage 104, and input matching shunt capacitors C2a/C2b for the second amplifier stage 104. Although an embodiment with quarter wave length transformers is shown, other transformer components, such as a lumped element transformers, can be used.

The input baluns 101/102 are used to convert an RF input signal into differential signals suitable for driving the differential input of the main amplifier stage 103 and auxiliary amplifier stage 104. In this example, the main amplifier stage 103 includes a first pair of common-source FETs 111a/111b, while the carrier amplifier stage 104 includes a second pair of common-source FETs 121a/121b. Explicit input matching networks for the amplifier stages are shown, but in another embodiment the input matching networks are absorbed into the input balun layouts. An explicit load $Z_L$ (for example, representing an antenna) is depicted at the combining node OUT, which serves as an output to the amplifier 100. The amplifier 100 receives an RF input signal at the input node IN.

In certain implementations, the first differential balun combiner 105 and/or the second differential balun combiner 106 are implemented using the balun layout 80 of FIG. 4.

Figure 7A:
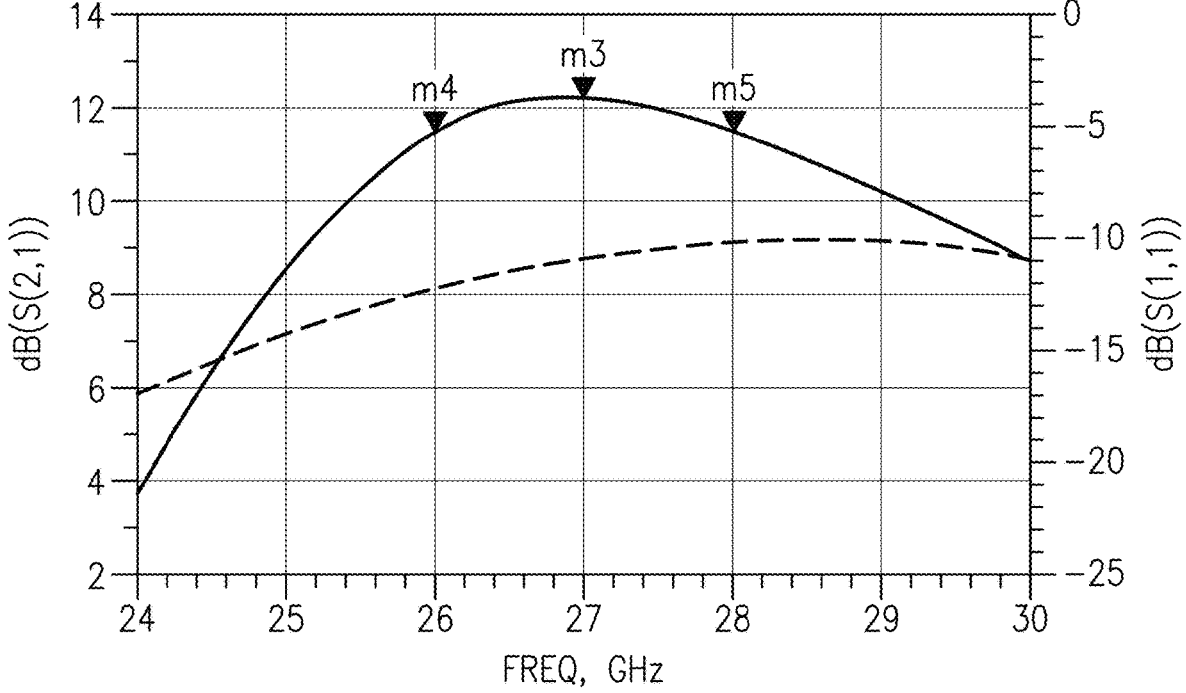
FIG. 7A is a graph of one example of S11 and S21 versus frequency for an RF amplifier.

FIG. 7A is a graph of one example of S11 and S21 versus frequency for an RF amplifier.

FIG. 7B is a graph of one example of output power versus input power for an RF amplifier.

FIG. 7C is a graph of one example of efficiency versus output power for an RF amplifier.

FIG. 7D is a graph of one example of phase distortion versus output power for an RF amplifier.

FIG. 7E is a graph of one example of amplitude distortion versus output power for an RF amplifier.

FIGS. 7A to 7E correspond to example simulations of the RF amplifier 100 of FIG. 6 in which the layouts of the baluns are modeled using s-parameters extracted from electromagnetic simulations.

Figure 8:
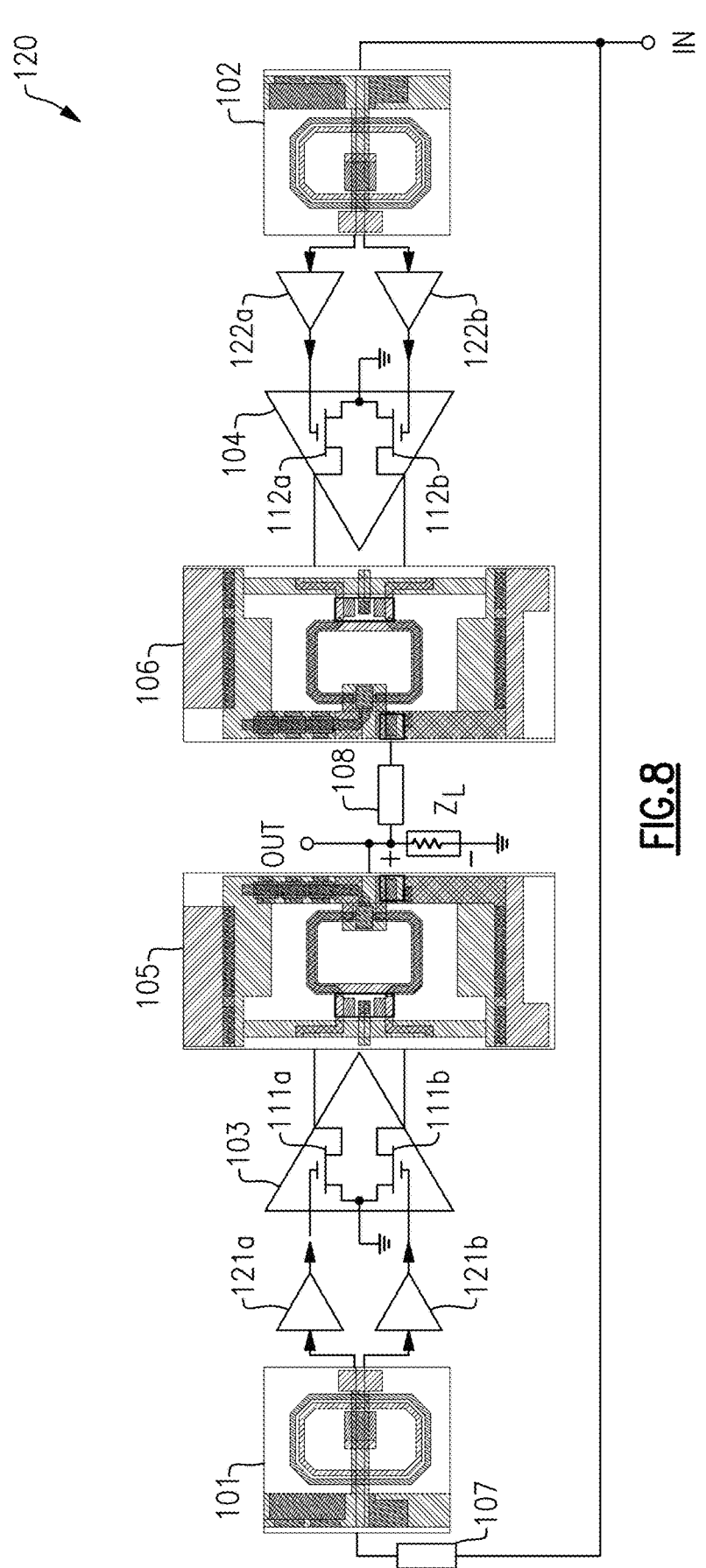
FIG. 8 is a schematic diagram of an RF amplifier according to another embodiment.

FIG. 8 is a schematic diagram of an RF amplifier 120 according to another embodiment. The RF amplifier 120 includes a first amplifier stage 103, a second amplifier stage 104, a first differential balun combiner 105, a second differential balun combiner 106, an input transformer component 107, an output transformer component 108, a first input balun 101, a second input balun 102, a first pair of input drivers 121a/121b, and a second pair of input drivers 122a/122b.

In comparison to the RF amplifier 100 of FIG. 6, the RF amplifier 120 of FIG. 8 omits the input matching series inductors L1a/L1b/L2a/L2b and the input matching shunt capacitors C1a/C1b/C2a/C2b in favor of including the first pair of input drivers 121a/121b and the second pair of input drivers 122a/122b.

In this embodiment, the first pair of input drivers 121a/121b (main input drivers) are included between the main input balun 101 and the main amplifier stage 103 for driving the non-inverted and inverted inputs, respectively. Additionally, the second pair of input drivers 122a/122b (auxiliary input drivers) are included between the auxiliary input balun 102 and the auxiliary amplifier stage 104 for driving the non-inverted and inverted inputs, respectively.

This split driver arrangement improves the line-up gain and hence, the power added efficiency (PAE).

In this embodiment, the input matching networks are absorbed into the input baluns, and the driver stages have outputs matched to directly drive the inputs of the main and auxiliary amplifier stages 103/104.

FIGS. 9A to 11D generally represent simulations and measured results for an RF amplifier 120 implemented in accordance with FIG. 8 operating over a first frequency band (24.5 GHz to 26.5 GHz) or a second frequency band (26 GHz to 28 GHz).

Figure 9B:
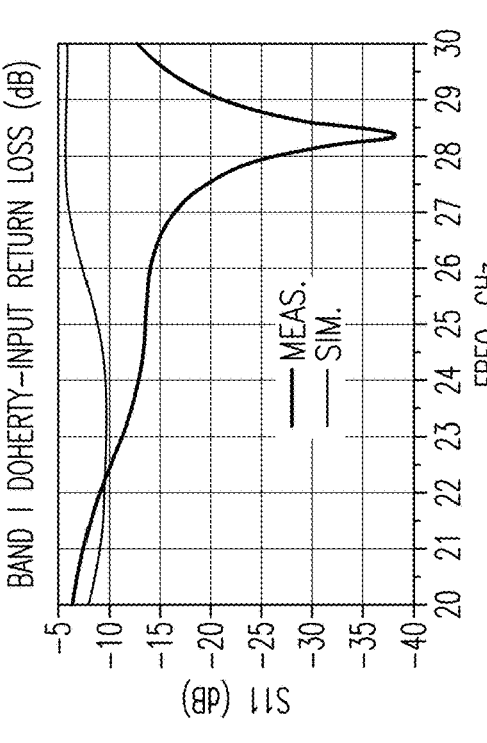
FIG. 9B is a graph of one example of input return loss versus frequency for an RF amplifier.
Figure 9D:
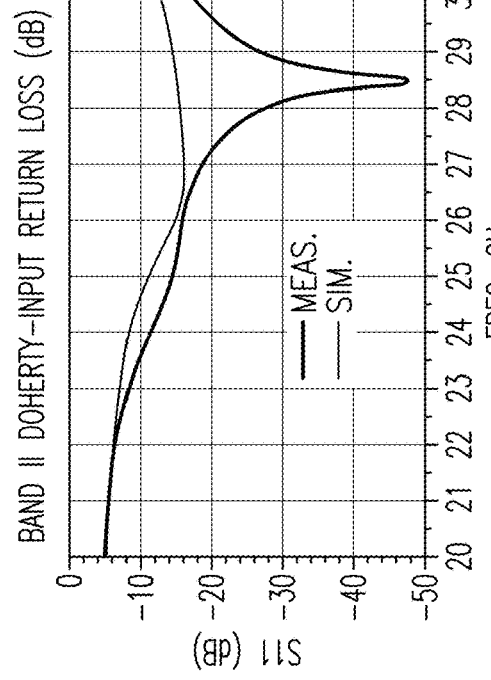
FIG. 9D is a graph of another example of input return loss versus frequency for an RF amplifier.
Figure 9A:
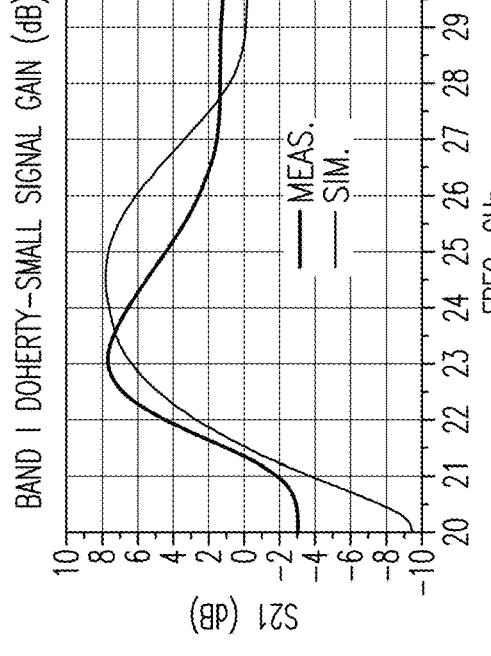
FIG. 9A is a graph of one example of small signal gain versus frequency for an RF amplifier.

FIG. 9A is a graph of one example of small signal gain versus frequency for an RF amplifier.

FIG. 9B is a graph of one example of input return loss versus frequency for an RF amplifier.

Figure 9C:
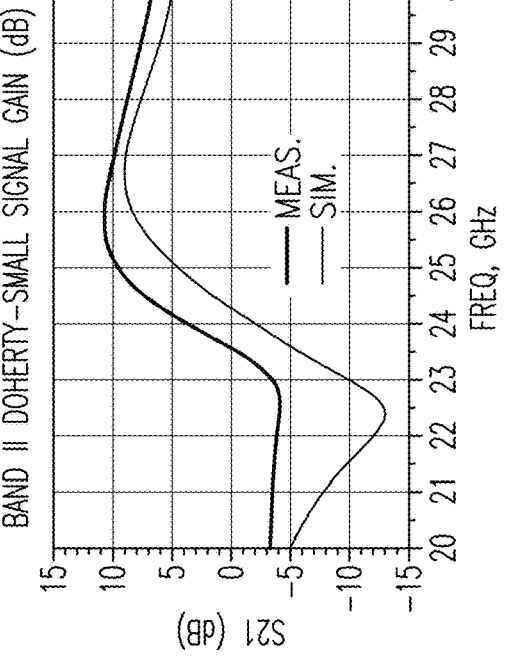
FIG. 9C is a graph of another example of small signal gain versus frequency for an RF amplifier.

FIG. 9C is a graph of another example of small signal gain versus frequency for an RF amplifier.

FIG. 9D is a graph of another example of input return loss versus frequency for an RF amplifier.

Figure 10A:
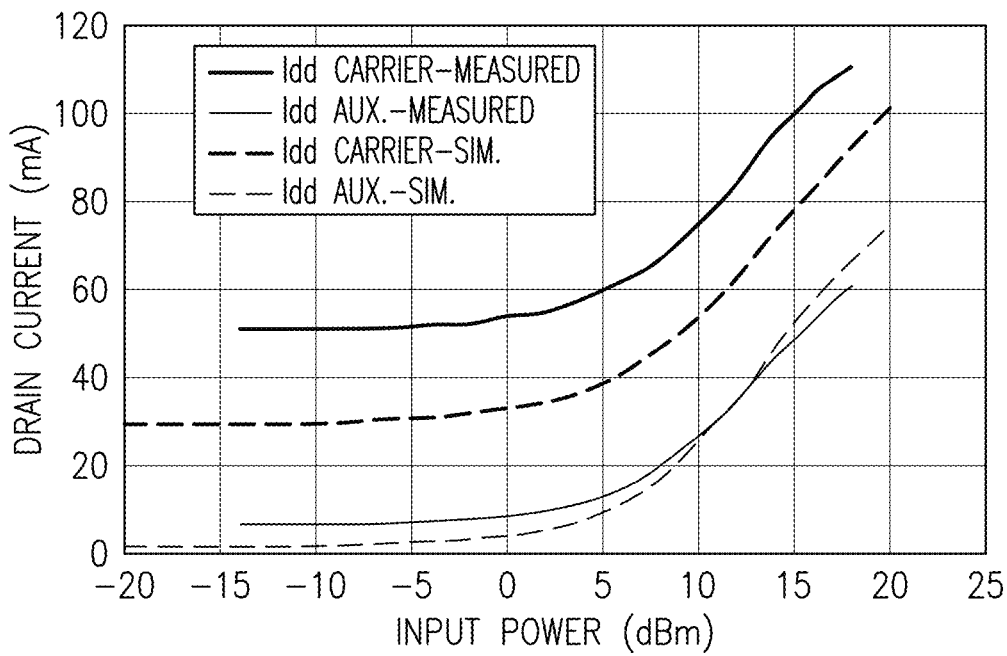
FIG. 10A is a graph of one example of drain current versus input power for an RF amplifier.

FIG. 10A is a graph of one example of drain current versus input power for an RF amplifier.

Figure 10B:
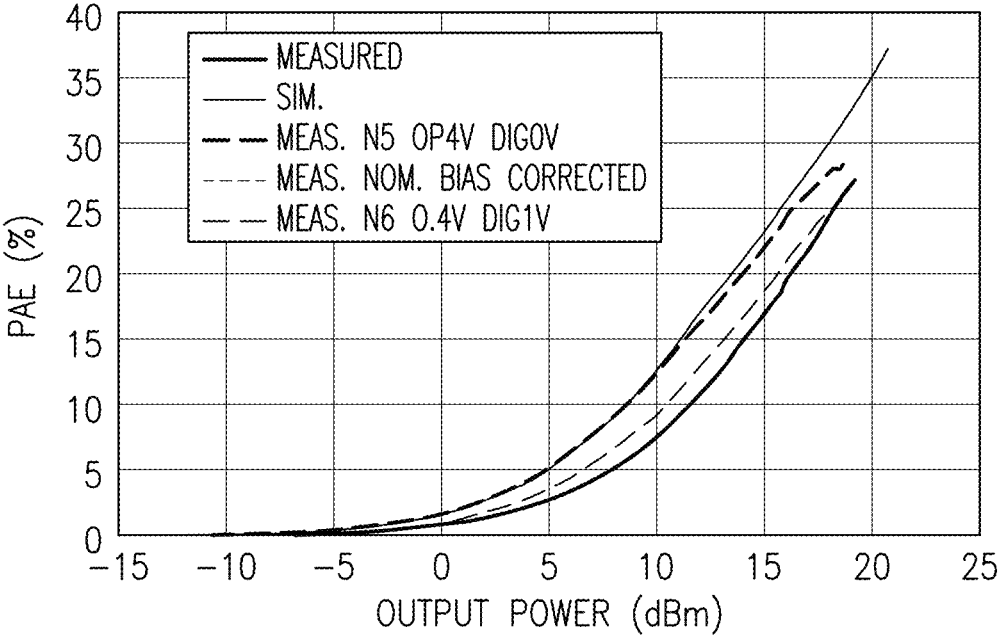
FIG. 10B is a graph of one example of efficiency versus output power for an RF amplifier.

FIG. 10B is a graph of one example of efficiency versus output power for an RF amplifier.

Figures 11A, 11B, 11C, 11D:
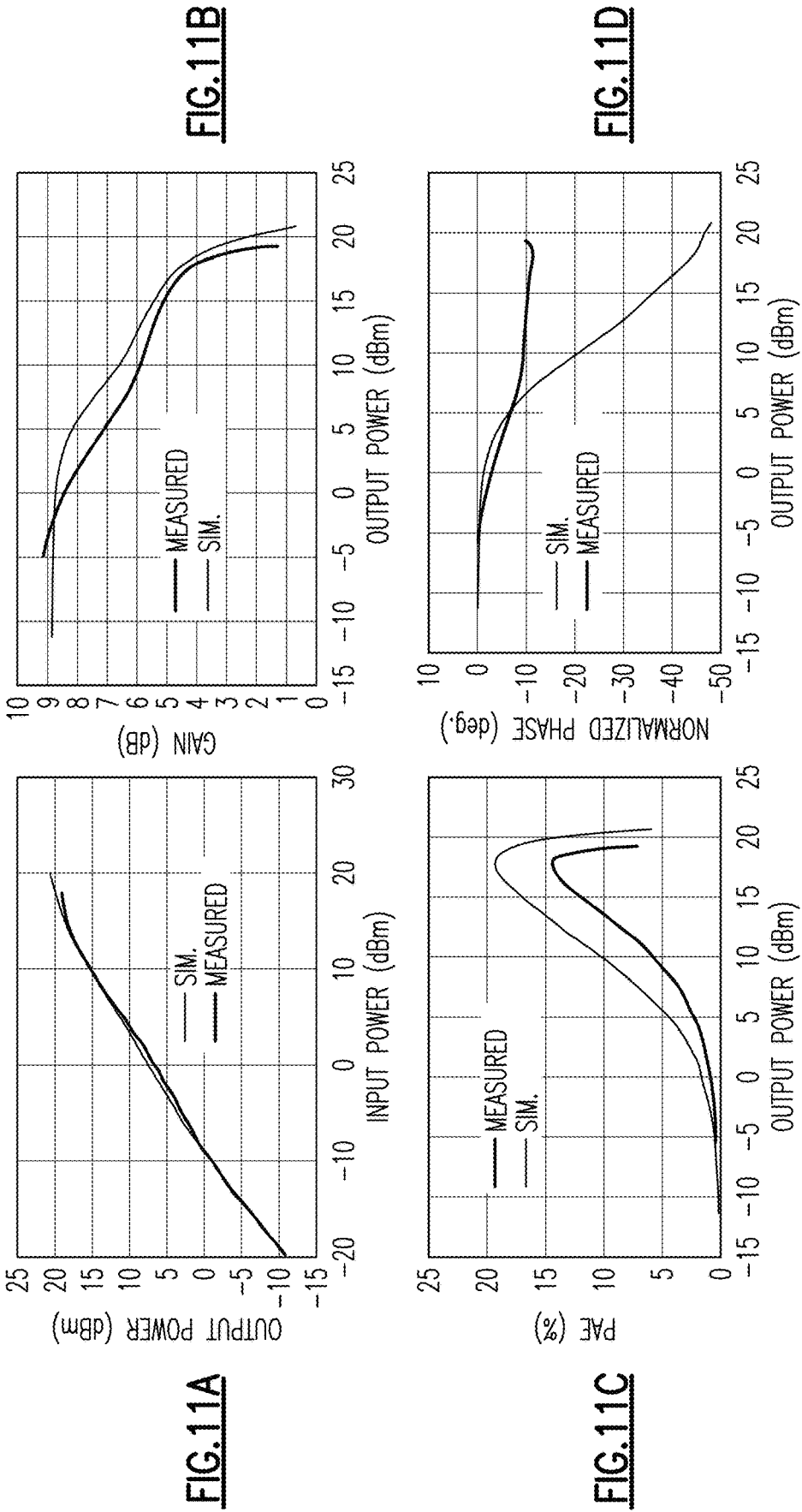
FIG. 11A is a graph of one example of output power versus input power for an RF amplifier.
FIG. 11B is a graph of one example of gain versus output power for an RF amplifier.
FIG. 11C is a graph of one example of efficiency versus output power for an RF amplifier.
FIG. 11D is a graph of one example of normalized phase versus output power for an RF amplifier.

FIG. 11A is a graph of one example of output power versus input power for an RF amplifier.

FIG. 11B is a graph of one example of gain versus output power for an RF amplifier.

FIG. 11C is a graph of one example of efficiency versus output power for an RF amplifier.

FIG. 11D is a graph of one example of normalized phase versus output power for an RF amplifier.

Applications

Devices employing the above described schemes can be implemented into various electronic devices. Examples of electronic devices include, but are not limited to, RF communication systems, consumer electronic products, electronic test equipment, communication infrastructure, etc. For instance, one or more RF amplifiers can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the K$_u$ band (about 12 GHz to 18 GHz), the K band (about 18 GHz to 27 GHz), the K$_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The RF signals amplified by the RF amplifiers herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The invention claimed is:

1. A radio frequency (RF) amplifier comprising:

an output node configured to output an RF output signal;

a main amplifier stage including a differential output;

a first differential balun combiner configured to provide a first single-ended RF signal to the output node and to receive a first differential RF signal from the differential output of the main amplifier stage, wherein the first differential balun combiner absorbs an output matching network of the main amplifier stage;

an auxiliary amplifier stage including a differential output, a first cascode transistor, and a second cascode transistor;

a transformer component; and a second differential balun combiner configured to generate a second single-ended RF signal and to receive a second differential RF signal from the differential output of the auxiliary amplifier stage, and to provide the second single-ended RF signal to the output node through the transformer component, the second differential balun combiner including a first conductor directly connected between a drain of the first cascode transistor and a drain of the second cascode transistor, wherein the second differential balun combiner absorbs an output matching network of the first cascode transistor and the second cascode transistor of the auxiliary amplifier stage.

2. The RF amplifier of claim 1, wherein the transformer component is a quarter wave length transformer.

3. The RF amplifier of claim 1, wherein the RF amplifier further comprises a first pair of driver amplifiers configured to drive a non-inverted input and an inverted input of the main amplifier stage, and a second pair of driver amplifiers configured to drive a non-inverted input and an inverted input of the auxiliary amplifier stage.

4. The RF amplifier of claim 1, wherein the first differential balun combiner and the second differential balun combiner are each implemented as a lumped element balun.

5. The RF amplifier of claim 1, wherein the auxiliary amplifier stage further includes a first common source transistor, a third cascode transistor connected between a drain of the first common source transistor and a source of the first cascode transistor, a second common source transistor, and a fourth cascode transistor connected between a drain of the second common source transistor and a source of the second cascode transistor.

6. The RF amplifier of claim 5 further comprising a first input balun configured to provide a first differential RF input signal to the main amplifier stage, and a second input balun configured to provide a second differential RF input signal to the auxiliary amplifier stage, the second differential RF input signal provided between a gate of the first common source transistor and a gate of the second common source transistor.

7. The RF amplifier of claim 6, further comprising an input node directly connected to an input of the second input balun and an input transformer component directly connected between the input node and an input of the first input balun.

8. The RF amplifier of claim 1, wherein the transformer component and a second conductor of the second differential balun combiner are directly connected in series between the output node and a ground voltage with no intervening components.

9. A front end system for controlling beamforming in an active scanned electronically steered array, the front end system comprising:

a phase shifter configured to control a phase of a radio frequency (RF) input signal; and an RF amplifier in series with the phase shifter and configured to amplify the RF input signal to generate an RF output signal at an output node, wherein the RF amplifier comprises:

a main amplifier stage including a differential output;

a first differential balun combiner configured to provide a first single-ended RF signal to the output node and to receive a first differential RF signal from the differential output of the main amplifier stage, wherein the first differential balun combiner absorbs an output matching network of the main amplifier stage;

an auxiliary amplifier stage including a differential output, a first cascode transistor, and a second cascode transistor;

a transformer component; and a second differential balun combiner configured to generate a second single-ended RF signal and to receive a second differential RF signal from the differential output of the auxiliary amplifier stage, and to provide the second single-ended RF signal to the output node through the transformer component, the second differential balun combiner including a first conductor directly connected between a drain of the first cascode transistor and a drain of the second cascode transistor, wherein the second differential balun combiner absorbs an output matching network of the first cascode transistor and the second cascode transistor of the auxiliary amplifier stage.

10. The front end system of claim 9, wherein the RF amplifier further comprises a first pair of driver amplifiers configured to drive a non-inverted input and an inverted input of the main amplifier stage, and a second pair of driver amplifiers configured to drive a non-inverted input and an inverted input of the auxiliary amplifier stage.

11. The front end system of claim 9, wherein the first differential balun combiner and the second differential balun combiner are each implemented as a lumped element balun.

12. The front end system of claim 9, wherein the auxiliary amplifier stage further includes a first common source transistor, a third cascode transistor connected between a drain of the first common source transistor and a source of the first cascode transistor, a second common source transistor, and a fourth cascode transistor connected between a drain of the second common source transistor and a source of the second cascode transistor.

13. The front end system of claim 12, further comprising a first input balun configured to provide a first differential RF input signal to the main amplifier, and a second input balun configured to provide a second differential RF input signal to the auxiliary amplifier, the second differential RF input signal provided between a gate of the first common source transistor and a gate of the second common source transistor.

14. The front end system of claim 13, further comprising an input node directly connected to an input of the second input balun and configured to receive the RF input signal, and an input transformer component directly connected between the input node and an input of the first input balun.

15. The front end system of claim 9, wherein the transformer component and a second conductor of the second differential balun combiner are directly connected in series between the output node and a ground voltage with no intervening components.

16. A method of radio frequency (RF) signal amplification, the method comprising:

amplifying a first differential RF input signal to generate a first differential RF signal using a main amplifier stage;

providing a first single-ended RF signal from a first differential balun combiner to an output node and receiving the first differential RF signal at the first differential balun combiner, wherein the first differential balun combiner absorbs an output matching network of the main amplifier stage;

amplifying a second differential RF input signal to generate a second differential RF signal using an auxiliary amplifier stage that includes a first cascode transistor and a second cascode transistor;

outputting a second single-ended RF signal from a second differential balun combiner and receiving the second differential RF signal at the second differential balun combiner, the second differential balun combiner including a first conductor directly connected between a drain of the first cascode transistor and a drain of the second cascode transistor, wherein the second differential balun combiner absorbs an output matching network of the first cascode transistor and the second cascode transistor of the auxiliary amplifier stage; and providing the second single-ended RF signal to the output node through a transformer component.

17. The method of claim 16, further comprising providing the first differential RF input signal to the main amplifier from a first pair of driver amplifiers, and providing the second differential RF input signal to the auxiliary amplifier from a second pair of driver amplifiers.

18. The method of claim 16, wherein the first differential balun combiner and the second differential balun combiner are each implemented as a lumped element balun.

19. The method of claim 16, wherein the auxiliary amplifier stage further includes a first common source transistor, a third cascode transistor connected between a drain of the first common source transistor and a source of the first cascode transistor, a second common source transistor, and a fourth cascode transistor connected between a drain of the second common source transistor and a source of the second cascode transistor, the method further comprising providing the first differential RF input signal to the main amplifier from a first input balun, and providing the second differential RF input signal to the auxiliary amplifier from a second input balun, the second differential RF input signal provided between a gate of the first common source transistor and a gate of the second common source transistor.

20. The method of claim 16, wherein the transformer component and a second conductor of the second differential balun combiner are directly connected in series between the output node and a ground voltage with no intervening components.

* * * * *